(12) United States Patent
Martin et al.

(10) Patent No.: US 9,377,251 B2
(45) Date of Patent: Jun. 28, 2016

(54) THERMAL GROUND PLANE FOR COOLING A COMPUTER

(71) Applicant: GLOBALFOUNDRIES INC., Grand Cayman (KY)

(72) Inventors: Yves Martin, Yorktown Heights, NY (US); Theodore G Van Kessel, Millbrook, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 107 days.

(21) Appl. No.: 14/301,623

(22) Filed: Jun. 11, 2014

(65) Prior Publication Data

US 2014/0290909 A1    Oct. 2, 2014

Related U.S. Application Data

(62) Division of application No. 12/550,090, filed on Aug. 28, 2009, now Pat. No. 8,776,868.

(51) Int. Cl.
   *F28F 3/12* (2006.01)
   *F28D 21/00* (2006.01)
   *H01L 23/427* (2006.01)

(52) U.S. Cl.
   CPC ........... *F28F 3/12* (2013.01); *F28D 2021/0031* (2013.01); *F28F 2230/00* (2013.01); *F28F 2255/02* (2013.01); *H01L 23/427* (2013.01); *H01L 2924/0002* (2013.01); *Y10T 29/53113* (2015.01)

(58) Field of Classification Search
   CPC ...... F28D 15/0241; F28F 2255/02; F28F 3/12
   USPC ............................................ 165/46, 80.2, 83
   See application file for complete search history.

(56) References Cited

U.S. PATENT DOCUMENTS

| | | |
|---|---|---|
| 4,580,619 A | 4/1986 | Aitken |
| 4,938,279 A | 7/1990 | Betker |
| 5,245,508 A | 9/1993 | Mizzi |
| 5,322,719 A | 6/1994 | Westling et al. |
| 5,370,178 A | 12/1994 | Agonafer et al. |
| 5,608,610 A | 3/1997 | Brzezinski |
| 5,685,363 A | 11/1997 | Orihira et al. |
| 5,740,018 A | 4/1998 | Rumbut, Jr. |
| 5,991,155 A | 11/1999 | Kobayashi et al. |
| 6,062,299 A | 5/2000 | Choo et al. |
| 6,154,363 A | 11/2000 | Chang |
| 6,166,907 A | 12/2000 | Chien |
| 6,216,771 B1 | 4/2001 | Holmberg et al. |
| 6,230,788 B1 | 5/2001 | Choo et al. |
| 6,282,913 B1 | 9/2001 | Moriguchi et al. |

(Continued)

FOREIGN PATENT DOCUMENTS

| | | |
|---|---|---|
| JP | 2006127445 A2 | 5/2006 |
| JP | 2006302223 A2 | 11/2006 |

*Primary Examiner* — Devon Russell
(74) *Attorney, Agent, or Firm* — Michael LeStrange; Hoffman Warnick LLC

(57) ABSTRACT

A method for cooling a computer uses thermal coupling for conveying heat from powered components of an electronic system. A fluid heat-exchanger is attached to the surface of the electronic system and filled with fluid coolant. A vacuum is applied between the heat-exchanger and the surface to seal the heat-exchanger to the electronic system. The fluid coolant is circulated through the heat-exchanger to convey heat from the fluid to an external cooling apparatus.

19 Claims, 4 Drawing Sheets

Method for connecting a computer to a thermal ground plane

Partial vacuum between water sleeve and computer provides a good mechanical and thermal contact over a large area

(56) References Cited

U.S. PATENT DOCUMENTS

| | | |
|---|---|---|
| 6,504,720 B2 | 1/2003 | Furuya |
| 6,622,782 B2 | 9/2003 | Malhammar |
| 6,690,578 B2 | 2/2004 | Edelmann |
| 6,865,077 B2 | 3/2005 | Igarashi |
| 6,904,956 B2 | 6/2005 | Noel |
| 7,007,741 B2 | 3/2006 | Sen et al. |
| 7,055,575 B2 | 6/2006 | Noel |
| 7,063,127 B2 | 6/2006 | Gelorme et al. |
| 7,167,366 B2 | 1/2007 | Cheon |
| 7,312,987 B1 | 12/2007 | Konshak |
| 7,626,815 B2 * | 12/2009 | Stefanoski .............. G06F 1/187 361/679.47 |
| 7,726,145 B2 * | 6/2010 | Nakamura ................ G06F 1/20 257/715 |
| 7,770,809 B2 | 8/2010 | Vafai et al. |
| 7,952,873 B2 * | 5/2011 | Glahn .................. H05K 7/1404 165/104.33 |
| 7,995,344 B2 | 8/2011 | Dando et al. |
| 8,000,103 B2 * | 8/2011 | Lipp .................... F28D 1/05316 165/104.33 |
| 8,215,377 B1 | 7/2012 | Monson et al. |
| 8,441,792 B2 | 5/2013 | Dunwoody et al. |
| 8,448,693 B2 | 5/2013 | Lundell et al. |
| 2002/0088605 A1 | 7/2002 | Malhammar |
| 2002/0105783 A1 | 8/2002 | Kitahara |
| 2003/0150605 A1 | 8/2003 | Belady et al. |
| 2004/0074630 A1 | 4/2004 | Sen et al. |
| 2004/0190255 A1 | 9/2004 | Cheon |
| 2005/0039879 A1 | 2/2005 | Hanai |
| 2005/0039884 A1 | 2/2005 | Pawlenko |
| 2008/0225484 A1 | 9/2008 | Brodsky |

* cited by examiner

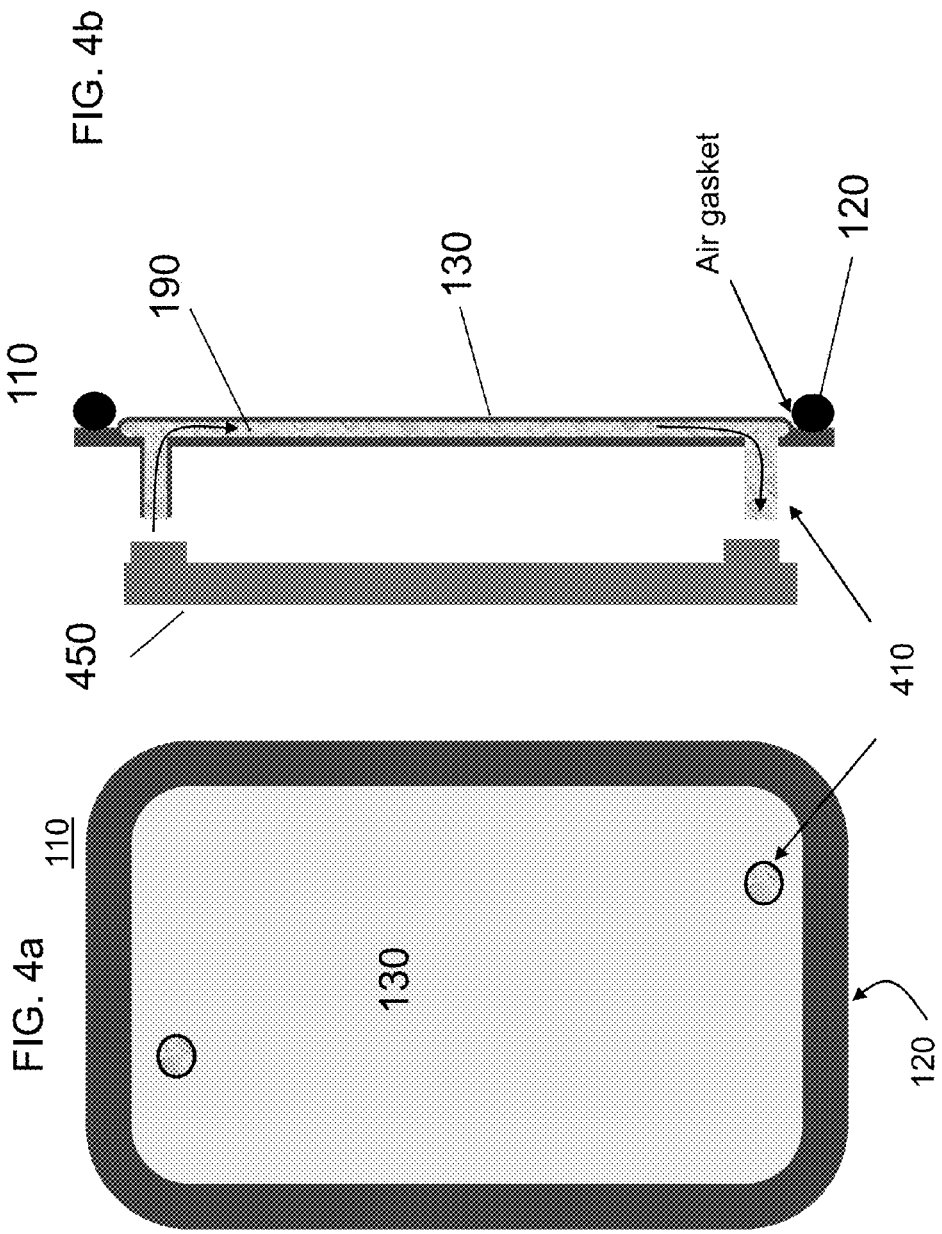

THERMAL GROUND PLANE FOR COOLING A COMPUTER

CROSS-REFERENCE TO RELATED APPLICATIONS

This application is a division of, and claims priority to, U.S. patent application Ser. No. 12/550,090, filed on Aug. 28, 2009, which is incorporated in its entirety as if fully set forth herein.

FIELD OF THE INVENTION

The invention disclosed broadly relates to the field of microprocessor chip cooling and more particularly relates to the field of water cooling.

BACKGROUND OF THE INVENTION

The evolution towards high power microprocessor chips has driven an increased interest in water cooling. Water cooling allows both high performance and energy-efficient computing. However, bringing water inside a computer has many drawbacks, including: 1) a risk of leaks, and therefore of computer down-time or failure. The risk increases when the number of water connections and couplings is large, which is the case in a multi-processor server; 2) difficult rework, servicing and upgrade of the server, due to the added complexity of the water connections; and 3) high cost. Some of the high cost is due to the larger number of costly no-drip water connectors.

There is a need for a cooling method that affords the advantages of water cooling without the above-stated drawbacks.

SUMMARY OF THE INVENTION

Briefly, according to an embodiment of the present disclosure, we disclose a method for cooling a computer by using thermal coupling for conveying heat from powered components of an electronic system to a surface of the electronic system. The method includes steps or acts of: removably attaching a fluid heat-exchanger to the surface of the electronic system, thus generating an enclosure bounded by the fluid heat-exchanger and the surface; filling the fluid heat-exchanger with a liquid coolant; applying a vacuum to the enclosure, removably sealing the fluid heat-exchanger to the surface; and circulating the fluid coolant through the fluid heat-exchanger to convey heat from the fluid away from the electronic system to an external cooling apparatus. The method also includes affixing a gasket to the enclosure.

BRIEF DESCRIPTION OF THE DRAWINGS

To describe the foregoing and other exemplary purposes, aspects, and advantages, we use the following detailed description of an exemplary embodiment of the disclosure with reference to the drawings, in which:

FIG. 4a shows the front perspective view of the water sleeve of FIG. 1a, according to an embodiment of the present disclosure; and FIG. 4b shows a side view of the water sleeve of FIG. 1a, indicating the inlet and outlet ports, according to an embodiment of the present disclosure.

Figure 1:
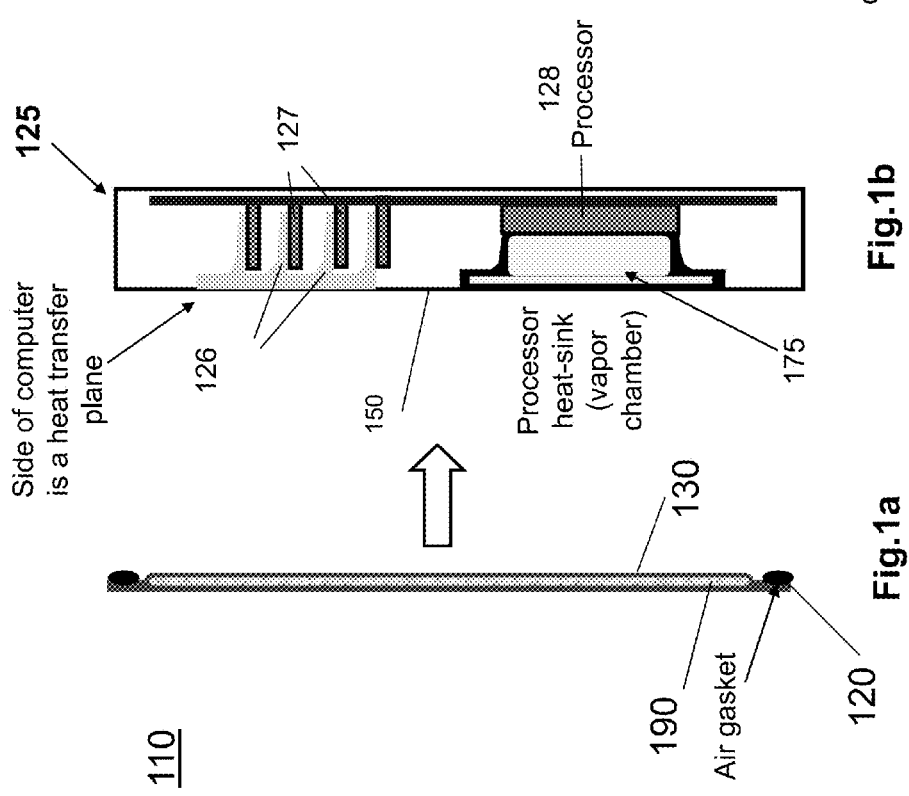
FIG. 1a shows a side view of the water sleeve, according to an embodiment of the present disclosure.
FIG. 1b shows a cross-sectional view of a computer, according to an embodiment of the present disclosure.
FIG. 1c shows a cross-sectional view of the computer of FIG. 1b coupled with the water sleeve of FIG. 1a, according to an embodiment of the present disclosure.

While the disclosure as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present disclosure.

DETAILED DESCRIPTION

We describe a method for cooling a computer by connecting a heat-transfer plane of a computer to a thermal ground plane, where the thermal ground plane is cooled by a liquid coolant. The thermal ground plane as described herein provides the advantages of water cooling while maintaining most of the water circuitry and complexity outside of the computer enclosure; thereby reducing or eliminating the drawbacks of water cooling, as previously discussed.

Water cooling is efficient and the heat generated in the computer can be primarily evacuated through the water. Because of the high efficiency of heat-spreading of vapor chambers or of heat-pipes, the concentrated heat of processors is spread over a large area (the heat-transfer plane). This way, only a small temperature drop occurs (1° to 10° C.) between the computer heat-transfer plane and the water sleeve. Compared to air cooled operation, the processor temperature is lowered more with water cooling.

By providing water cooling in a removable sleeve outside of the computer, we reduce the risk of computer down time or failure. The water circuit is primarily kept outside of the computer enclosure. Furthermore, the complexity of the water path is reduced, with few or no water connectors. The water sleeve as described provides for easy maintenance and upgrade, especially for blade servers. Because the water-cooling sleeve is so easily disengaged from the blade server, a blade can be plugged in and out without having to break any water connection. The removable sleeve is easily attached and removed from the computer by applying and removing a vacuum.

According to an embodiment of the present invention, a connecting side of the thermal ground plane is a thin, flexible, non-permeable membrane for holding and circulating a liquid coolant such as water or a refrigerant. A partial vacuum is applied between the thermal ground plane and the computer to secure the thermal ground plane to the heat transfer plane. Surface treatments can be applied to the connecting sides to enhance thermal conductivity.

Referring now to the drawings and to FIG. 1a in particular, we show one embodiment of the present invention wherein one or more thin sleeves 110 (shown in a side view) are filled with a liquid coolant such as running water 190 and act as a thermal ground plane. Note that other liquid coolants can also be advantageously used within the spirit and scope of the invention, such as water with antifreeze additives like glycol. The liquid coolant is inserted into the sleeve 110 through an inlet connection (a port or pipe connection) and runs continuously through the sleeve 110 and out through an outlet. Further, when filling the sleeve 110 it is preferable not to overfill, but rather to provide enough coolant 190 for cooling purposes, but not so much that the sleeve 110 is stretched taut to the point where it is unable to deform when filled.

The surface of the sleeve 110 that comes into contact with the computer is made out of a thin and flexible (preferentially) metallic sheet or membrane 130 (0.1 to 0.5 mm thick). The membrane 130 can be made from thin copper, nickel, aluminum or stainless sheets, as well as polymer sheet (PVC, polyimide . . . ). A gasket 120 (possibly made out of silicone rubber), shown in cross-section here, is provided along a perimeter of the sleeve 110.

FIG. 1a shows the water sleeve 110 and FIG. 1b shows the computer 125. FIG. 1c shows the two assembled together, with a partial vacuum applied between the two. Referring now to FIG. 1b, in order to be applicable to computer cooling, one side of a computer enclosure 125 is made relatively flat, and is designated as a heat-transfer plane 150. The heat-generating elements within the computer enclosure 125 are thermally connected to the heat-transfer plane 150. When the sleeve 110 is placed on the heat-transfer plane 150, with the liquid-filled side 130 in contact with the relatively flat surface of the heat-transfer plane 150, the membrane 130 of the liquid-filled sleeve 130 is able to conform to the contours of the heat-transfer plane 150. When contact is made, the gasket 120 is able to removably seal an enclosure defined by the flat surface 150 of the computer 125, the sleeve 110, and the gasket 120.

When a vacuum is applied to this enclosure, the fluid-filled sleeve 130 inside of the enclosure is sealed to the flat surface 150 by action of the atmospheric pressure. The sleeve 130 is free to deform in order to match the non-ideal flatness of the surface 150. A low thermal resistance is realized between the deformed thin sleeve 130 and the flat surface 150. Thus, a good thermal conduction path is realized between the flat surface 150 of the computer 125 and the thin sleeve 130.

FIG. 1b shows a side view of a computer 125, viewed in cross-section, and where only a few components are displayed: a processor module 128, a few memory chips 127, and a plurality of heat-conducting structures 126 and 175. The heat-conducting structures are lined up close to the flat surface 150 of the computer case 125 or are part of the computer case 125. They carry the heat from the heat-generating devices, including the processor module 128 and the memory chips 127, to the heat-transfer plane 150.

For a high power element such as a processor module 128, the heat conducting structure can be a vapor chamber 175 which provides efficient transfer and spread of heat from the relatively small processor 128 to the relatively wide heat-transfer plane 150. Alternately, heat-pipes (now commonly used in efficient heat-sinks) can be used to couple the processor to the heat-transfer plane 150. For the memory chips 127, heat-pipes or more simple heat conductive structures made out of a good conductive material such as copper or aluminum also provide good thermal conduction between the memory chips 127 and the heat-transfer plane 150.

Referring to FIG. 1c, the computer 125 is shown with the water sleeve 110 attached and filled with water 190 or another suitable liquid coolant. A vacuum is applied between the fluid-filled sleeve 110 and the computer 125, and therefore a good thermal conduction path is realized between the computer components and the liquid coolant 190.

Figure 2:
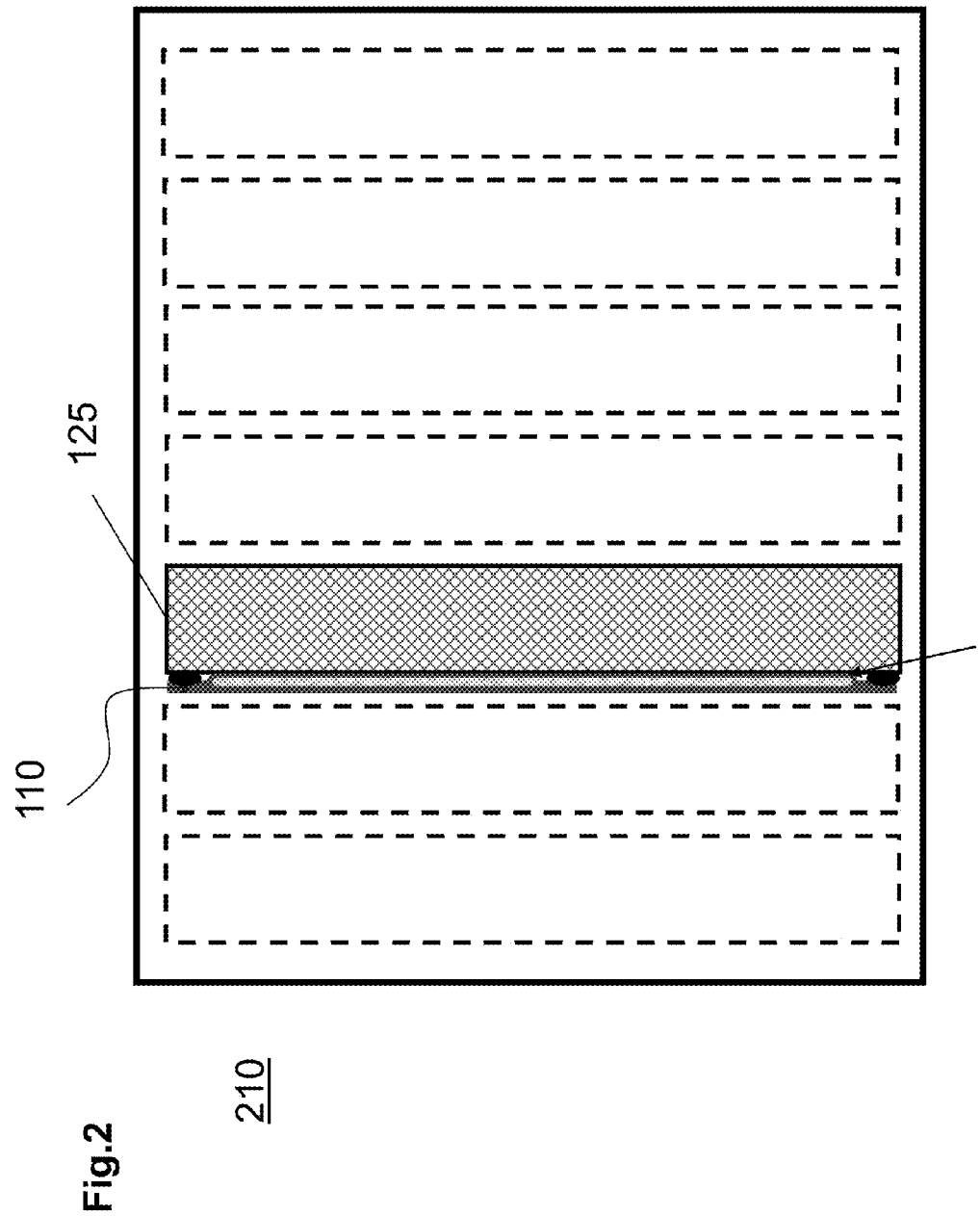
FIG. 2 is an exemplary illustration of a blade server computer, connected to a water sleeve, inside a blade center, according to an embodiment of the present disclosure.

Referring to FIG. 2, we show an exemplary embodiment wherein the computer 125 is a blade (also called a blade server), which is inserted in a blade center 210 (rack with slots). After the blade server 125 is inserted into the blade center 210, a vacuum is applied between the sleeve 110 and the blade 125. The vacuum serves to establish a good thermal connection between the sleeve 110 and the blade 125. Before removal of the blade 125, the vacuum is first turned off.

Figure 3:
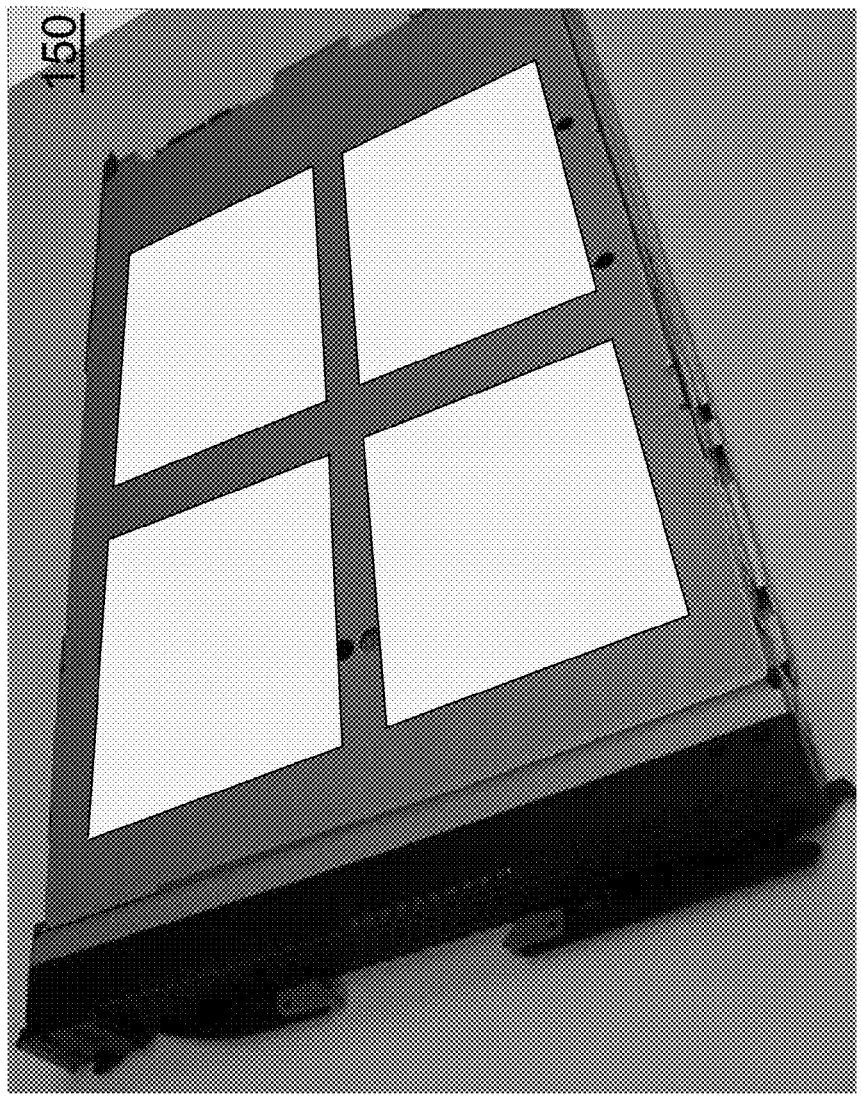
FIG. 3 shows an exemplary heat-transfer plane for a blade server, according to an embodiment of the present disclosure.

FIG. 3 shows a blade server 125 with a heat-transfer plane 150 having several discrete sections that are connected to two processor vapor chambers, and two heat-conducting structures attached to memory and to other low power chips. Despite having several discrete sections, the heat-transfer plane 150 is made relatively flat and air tight for vacuum connection to a water sleeve 110.

To enhance the thermal conduction between the sleeve 110 and the computer 125, one or both surfaces can be coated with a very thin layer (1 to 10 microns) of a soft conductive material, such as silicone, gel, oil, latex, grease, and other like thermal interface materials that are used in the computer industry. It is preferable to coat the surface of the membrane 130 that will come into contact with the heat transfer plane 150.

FIG. 4a shows a front view of the water sleeve 110 according to an embodiment of the present invention. The water inlet/outlet ports 410 run perpendicular to the sleeve 110; therefore they are shown in cross-section. The gasket seal 120 is also shown surrounding the sleeve 110. FIG. 4b shows a side view of the sleeve 110, indicating the circulation of the liquid 190 in and through the membrane 130, then out through the water port 410. Circulating the liquid 190 serves to enhance the cooling effect provided by the thermal transfer plane. The liquid 190 is circulated by an external water cooling circuit 450 coupled with the sleeve 110 through the ports 410. The circulating liquid 190 carries away the heat generated by the computer 125. The water cooling circuit 450 can include a pump that maintains the fluid in circulation and a cooling device such as a finned radiator with a fan.

Therefore, while there has been described what is presently considered to be the preferred embodiment, it will understood by those skilled in the art that other modifications can be made within the spirit of the invention. The above description of an embodiment is not intended to be exhaustive or limiting in scope. The embodiment, as described, was chosen in order to explain the principles of the invention, show its practical application, and enable those with ordinary skill in the art to understand how to make and use the invention. It should be understood that the invention is not limited to the embodiment described above, but rather should be interpreted within the full meaning and scope of the appended claims.

We claim:

1. A method for cooling an electronic system, said method comprising:
   removably coupling a fluid heat-exchanger to a surface of the electronic system, thus generating an enclosure bounded by said fluid heat-exchanger and said surface, wherein the coupling of the fluid heat-exchanger includes coupling a flexible and conformal sleeve to the surface of the electronic system, the sleeve including:
      at least one flexible surface,
      at least one port for fluid inlet, and
      at least one port for fluid outlet;
   filling the fluid heat-exchanger with a liquid coolant;
   applying a vacuum to the enclosure, removably sealing the fluid heat-exchanger to the surface; and
   circulating the fluid coolant through the fluid heat-exchanger, conveying heat from said fluid coolant away from the electronic system.

2. The method of claim 1 further comprising removing the vacuum to detach the fluid heat-exchanger.

3. The method of claim 1 wherein removably coupling the fluid heat exchanger comprises removably coupling a vapor chamber to the surface of the electronic system.

4. The method of claim 1 wherein removably coupling the fluid heat exchanger comprises removably coupling a heat pipe to the surface of the electronic system.

5. The method of claim 1 wherein removably coupling the fluid heat exchanger comprises removably coupling a copper block to the surface of the electronic system.

6. The method of claim 1 wherein removably coupling the heat exchanger comprises removably coupling an aluminum block to the surface of the electronic system.

7. The method of claim 1 further comprising optimizing the vacuum by applying a gasket to the enclosure.

8. The method of claim 1 further comprising coating the fluid heat-exchanger with a layer of a soft conductive material, wherein said layer is between one and ten microns thick.

9. The method of claim 8 wherein the soft conductive material is selected from a group consisting of: silicone, gel, oil, latex, and grease.

10. The method of claim 1 wherein applying the vacuum comprises applying a partial vacuum.

11. The method of claim 1 comprising coupling multiple fluid heat-exchangers to the surface of the electronic system.

12. The method of claim 2 further comprising detaching the fluid heat-exchanger from the electronic system after removing the vacuum.

13. The method of claim 1 wherein the flexible surface is a metallic sheet.

14. The method of claim 13 wherein the metallic sheet comprises a thickness of between 0.1 to 0.5 millimeters.

15. The method of claim 1 wherein circulating the fluid coolant comprises circulating at least one of water, glycol, and a refrigerant.

16. The method of claim 1 further comprising coupling the fluid heat-exchanger to an external cooling apparatus.

17. The method of claim 16 wherein the external cooling apparatus comprises a radiator and a fan.

18. The method of claim 16 further comprising coupling an external fluid pump with the external cooling apparatus.

19. The method of claim 18 wherein circulating the fluid coolant comprises using the external fluid pump to circulate the fluid coolant through the fluid heat-exchanger.

\* \* \* \* \*